(12) United States Patent
Li et al.

(10) Patent No.: US 10,446,473 B1
(45) Date of Patent: Oct. 15, 2019

(54) SEMICONDUCTOR DEVICE AND METHOD OF FORMING THE SAME

(71) Applicant: UNITED MICROELECTRONICS CORP., Hsinchu (TW)

(72) Inventors: Xiang Li, Republic of Singapore (SG); Ding-Lung Chen, Republic of Singapore (SG); En-Feng Liu, Republic of Singapore (SG); Yu-Cheng Tung, Kaohsiung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/250,485

(22) Filed: Jan. 17, 2019

Related U.S. Application Data

(62) Division of application No. 15/981,955, filed on May 17, 2018, now Pat. No. 10,276,476.

(51) Int. Cl.

| | |
|---|---|
| *H01L 21/768* | (2006.01) |
| *H01L 23/532* | (2006.01) |
| *H01L 23/522* | (2006.01) |
| *H01L 29/40* | (2006.01) |
| *H01L 23/48* | (2006.01) |
| *H01L 29/66* | (2006.01) |
| *H01L 29/786* | (2006.01) |

(52) U.S. Cl.
CPC ...... *H01L 23/481* (2013.01); *H01L 21/76877* (2013.01); *H01L 23/5223* (2013.01); *H01L 23/5226* (2013.01); *H01L 23/53228* (2013.01); *H01L 29/401* (2013.01); *H01L 29/66969* (2013.01); *H01L 29/7869* (2013.01)

(58) Field of Classification Search
CPC ............... H01L 23/481; H01L 23/5226; H01L 23/53228; H01L 27/1251; H01L 29/7869; H01L 27/1255; H01L 29/4012; H01L 21/76898; H01L 21/486
See application file for complete search history.

(56) References Cited

U.S. PATENT DOCUMENTS

| | | | |
|---|---|---|---|
| 9,666,491 B1 | 5/2017 | Zhou et al. | |
| 2012/0326328 A1* | 12/2012 | Li | ........................ H01L 23/481 257/774 |
| 2015/0179810 A1 | 6/2015 | Yamazaki et al. | |
| 2017/0098599 A1 | 4/2017 | Zhou et al. | |

* cited by examiner

*Primary Examiner* — Thanhha S Pham
(74) *Attorney, Agent, or Firm* — WPAT, PC

(57) ABSTRACT

A semiconductor device and a method of forming the semiconductor device are provided. The semiconductor device includes a substrate, an interconnection structure, an oxide semiconductor (OS) transistor and a contact structure. The substrate has a first surface and a second surface opposite to the first surface. The interconnection structure is disposed on the first surface, and the oxide semiconductor (OS) transistor is disposed on the second surface. Also, the OS transistor includes a back gate disposed on the second surface of the substrate. The contact structure is formed between the OS transistor and the interconnection structure, and the contact structure is electrically connected to the back gate. The contact structure penetrates through the substrate for electrically connecting the interconnection structure to the OS transistor.

10 Claims, 14 Drawing Sheets

US 10,446,473 B1

SEMICONDUCTOR DEVICE AND METHOD OF FORMING THE SAME

CROSS REFERENCE TO RELATED APPLICATIONS

This application is a Divisional of pending U.S. patent application Ser. No. 15/981,955, filed May 17, 2018, and entitled "SEMICONDUCTOR DEVICE AND METHOD OF FORMING THE SAME", the contents of which are incorporated herein by reference.

BACKGROUND

Technical Field

The present disclosure relates in general to a semiconductor device and a method of forming the semiconductor device, and more particularly to a semiconductor device including an oxide semiconductor transistor and a method of forming the semiconductor device.

Description of the Related Art

With the development of technology and the increase of applications for electronic devices, IC devices with smaller sizes have been largely utilized. In the meantime, oxide semiconductor materials have been applied in field effect transistors (FETs) of ICs for their semiconductor material properties. In order to further develop and improve such devices with oxide semiconductor transistors, researches and developments in the designs of such devices have been disclosed.

SUMMARY OF THE INVENTION

The present disclosure is directed to a semiconductor device and a method of forming the semiconductor device. According to the embodiments of the present disclosure, in the semiconductor device, the contact structure penetrates through the substrate and is located between the interconnection structure and the OS transistor, such that the device area can be largely reduced, and the contact path between the OS transistor and the interconnection structure can be significantly shortened.

According to an embodiment of the present disclosure, a semiconductor device is disclosed. The semiconductor device includes a substrate, an interconnection structure, an oxide semiconductor (OS) transistor and a contact structure. The substrate has a first surface and a second surface opposite to the first surface. The interconnection structure is disposed on the first surface, and the oxide semiconductor (OS) transistor is disposed on the second surface. Also, the OS transistor comprises a back gate disposed on the second surface of the substrate. The contact structure is formed between the OS transistor and the interconnection structure, and the contact structure is electrically connected to the back gate. The contact structure penetrates through the substrate for electrically connecting the interconnection structure to the OS transistor.

According to another embodiment of the present disclosure, a method of forming a semiconductor device is disclosed. The method of forming the semiconductor device includes the following steps: providing a substrate having a first surface and a second surface opposite to the first surface; forming a logic device on the first surface; after forming the logic device, forming an interconnection structure having M metal layers on the first surface; after forming the interconnection structure having the M metal layers, forming a contact structure penetrating through the substrate; after forming the contact structure, forming an oxide semiconductor (OS) transistor on the second surface, wherein the contact structure is located between the OS transistor and the interconnection structure and electrically connects the interconnection structure to the OS transistor; and forming a (M+1)th metal interconnect layer on the interconnection structure.

The disclosure will become apparent from the following detailed description of the preferred but non-limiting embodiments. The following description is made with reference to the accompanying drawings.

DETAILED DESCRIPTION OF THE INVENTION

Figure 1:
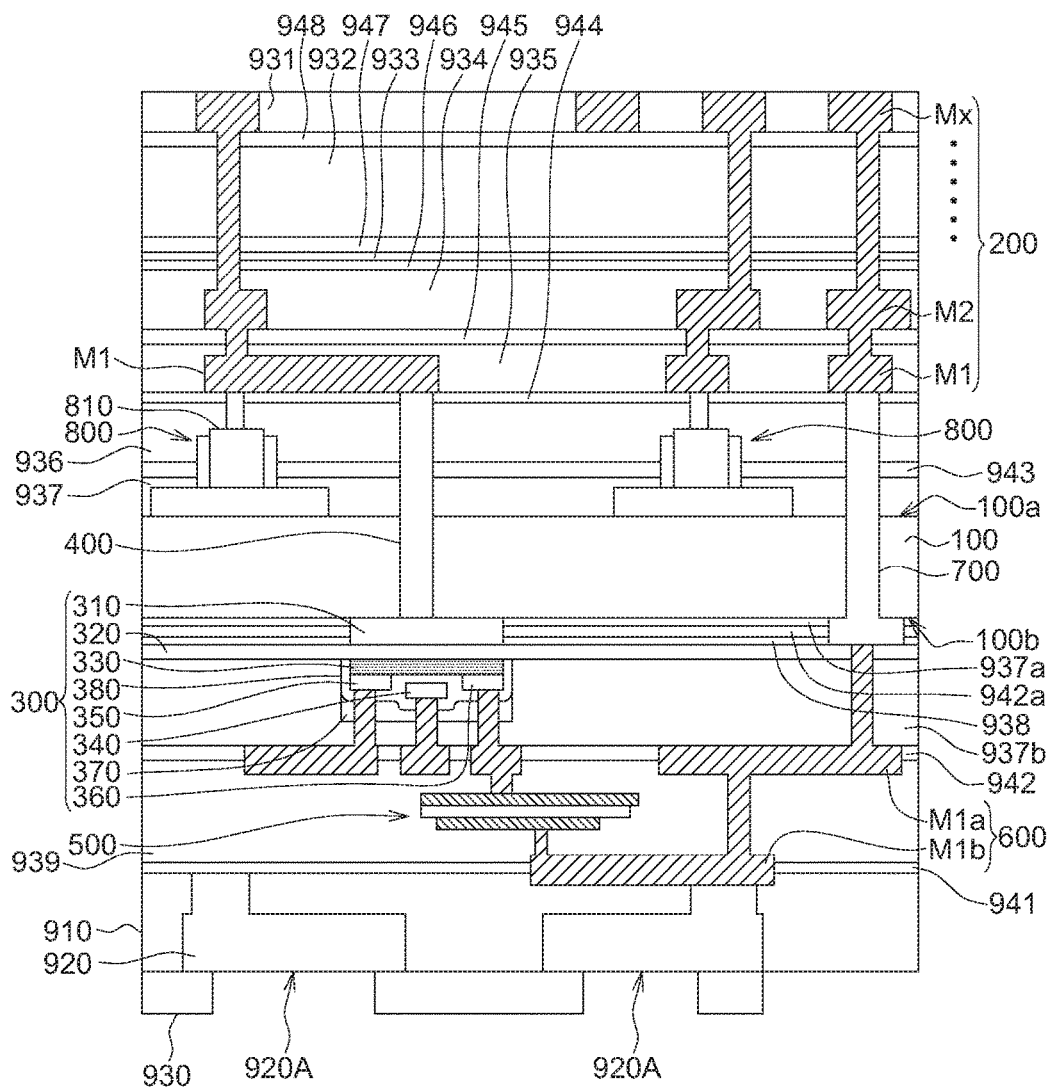
FIG. 1 shows a schematic drawing of a semiconductor device according to an embodiment of the present disclosure.

According to the embodiments of the present disclosure, a semiconductor device and a method of forming the semiconductor device are provided. The embodiments are described in details with reference to the accompanying drawings. The details of the embodiments are for exemplification only, not for limiting the scope of protection of the disclosure. Moreover, the identical or similar elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regarded as an illustrative sense rather than a restrictive sense. It is to be noted that the drawings are simplified for clearly describing the embodiments, and the details of the structures of the embodiments are for exemplification only, not for limiting the scope of protection of the disclosure. Ones having ordinary skills in the art may modify or change the structures according to the embodiments of the present disclosure.

FIG. 1 shows a schematic drawing of a semiconductor device according to an embodiment of the present disclosure. As shown in FIG. 1, the semiconductor device 10 includes a substrate 100, an interconnection structure 200, an oxide semiconductor (OS) transistor 300 and a contact structure 400. The substrate 100 has a first surface 100a and a second surface 100b opposite to the first surface 100a. The interconnection structure 200 is disposed on the first surface 100a, and the oxide semiconductor (OS) transistor 300 is disposed on the second surface 100b. The contact structure 400 is formed between the OS transistor 300 and the interconnection structure 200, and the contact structure 400 penetrates through the substrate 100 for electrically connecting the interconnection structure 200 to the OS transistor 300.

In conventional designs, through silicon vias (TSVs) are usually used for electrically connecting a OS transistor to an interconnection structure which are located on two opposite sides of a substrate, wherein the TSVs penetrating through the substrate are formed on the lateral side of the OS transistor and are electrically connected to the OS transistor through additional metal layers which are arranged parallel to the interconnection structure resulting in an increase of the device area. In contrast, according to the embodiments of the present disclosure, the contact structure 400 penetrates through the substrate 100 and is fully located between the interconnection structure 200 and the OS transistor 300, such that the device area which could have been used for the TSVs can be largely reduced.

In addition, according to the embodiments of the present disclosure, as shown in FIG. 1, the contact structure 400 is in direct contact with the OS transistor 300 for further electrically connecting the OS transistor 300 to the interconnection structure 200; in other words, the OS transistor 300 is electrically connected to the contact structure 400 without any additional metal layers formed there-between, such that the contact path between the OS transistor 300 and the interconnection structure 200 can be significantly shortened.

In the embodiments, the OS transistor 300 is such as an OSFET.

As shown in FIG. 1, the semiconductor device 10 may further include a capacitor 500. In the present embodiment, the capacitor 500 is disposed on the second surface 100*b* of the substrate 100.

In the embodiments, as shown in FIG. 1, the OS transistor 300 includes a back gate 310 disposed on the second surface 100*b* of the substrate 100, and the contact structure 400 is electrically connected to the back gate 310. As shown in FIG. 1, in the embodiments, the contact structure 400 is in direct contact with the back gate 310 of the OS transistor 300.

In the embodiments, the OS transistor 300 may further include a gate insulator film 320, an oxide semiconductor (OS) layer 330, a gate electrode 340 and two electrodes 350 and 360. The gate insulator film 320 is disposed on the back gate 310, the OS layer 330 is disposed on the gate insulator film 320, the gate electrode 340 is disposed on the OS layer 330, and the two electrodes 350 and 360 are disposed on the OS layer 330 and located on two lateral sides of the gate electrode 340.

In some embodiments, the OS transistor 300 may further include insulating layers 370 and 380, the insulating layer 380 may be a gate insulating film covering the gate electrode 340 and the two electrodes 350 and 360, and the insulating layer 370 may be formed of aluminum oxide and disposed on the insulating layer 380.

As shown in FIG. 1, in the embodiments, the interconnection structure 200 includes a plurality of metal layers, for example, the plurality of metal layers may include a first metal layer M1, a second metal layer M2, and all the way to the xth metal layer M*x*. This can be referred that the interconnection structure 200 includes M metal layers, and M is an integer. In one example, M≥2. The first metal layer M1 is most adjacent to the first surface 100*a* of the substrate 100 among the plurality of metal layers, and the contact structure 400 is electrically connected to the first metal layer M1.

In other words, according to the embodiments of the present disclosure, the contact structure 400 electrically connecting the interconnection structure 200 to the OS transistor 300 is fully located between the first metal layer M1 of the interconnection structure 200 and the back gate 310 of the OS transistor 300 providing a reduced contact path between the interconnection structure 200 and the OS transistor 300. In addition, while the contact structure 400 is fully located between the interconnection structure 200 and the OS transistor 300 rather than arranged on lateral sides of the interconnection structure 200 and the OS transistor 300, the device area is largely reduced accordingly.

As shown in FIG. 1, the semiconductor device 10 may further include an additional interconnection structure 600 and an additional contact structure 700. The additional interconnection structure 600 is disposed on the second surface 100*b* of the substrate 100 and electrically connected to the OS transistor 300, and the additional contact structure 700 penetrates through the substrate 100 and electrically connects the additional interconnection structure 600 to the interconnection structure 200. For example, the additional contact structure 700 is electrically connected to and in direct contact with the first metal layer M1 of the interconnection structure 200.

In the embodiments of the present disclosure, the number of metal layers of the additional interconnection structure 600 is less than the number of metal layers of the interconnection structure 200. For example, the additional interconnection structure 600 may include one layer M1*a* or two layers M1*a* and M1*b* of copper metal.

According to the embodiments, the OS transistor 300 and the additional interconnection structure 600 are located on the same side with respect to the substrate 100, and the additional interconnection structure 600 includes less metal layers than the interconnection structure 200 does, particularly for the cases where the metal layers are formed of copper metal, and thus the OS transistor 300 can suffer from less thermal processes resulted from the manufacturing processes of the metal layers, e.g. metal layers formed of copper metal, such that the electrical properties of the OS transistor 300 can be less influenced thermally, and thus and performance stability of the OS transistor 300 can be improved.

As shown in FIG. 1, the semiconductor device 10 may further include a logic device comprising a transistor 800. In one example, the transistor 800 includes a polysilicon layer 810 disposed on the first surface 100*a* of the substrate 100. In the embodiment, the transistor 800 is such as a SiFET.

As shown in FIG. 1, the semiconductor device 10 may further include a dielectric layer 910 and a conductive wiring structure 920, the dielectric layer 910 is formed on the OS transistor 300, and the conductive wiring structure 920 is formed in the dielectric layer 910 exposing a bonding pad region 920A. In the embodiments, the dielectric layer 910 may be formed of silicon oxide, and the conductive wiring structure 920 may be formed of aluminum, but the present disclosure is not limited thereto.

In the embodiments, the semiconductor device 10 may further include a passivation layer 930 formed on the dielectric layer 910 for exposing the boding pad region 920A of the conductive wiring structure 920.

In the embodiments, the semiconductor device 10 may include a plurality of dielectric layers located on two opposite sides of the substrate 100. For example, the semiconductor device 10 may include dielectric layers 931, 932, 933, 934, 935, 936, 937, 937*a*, 937*b*, 938 and 939 and dielectric layers 941, 942, 942*a*, 943, 944, 945, 946, 947 and 948, the dielectric layers 931-939 are, for example, silicon oxide layers, and the dielectric layers 941-948 are, for example, silicon nitride layers. For example, in some embodiments, the dielectric layer 943 may be a contact etching stop layer.

Figure 2:
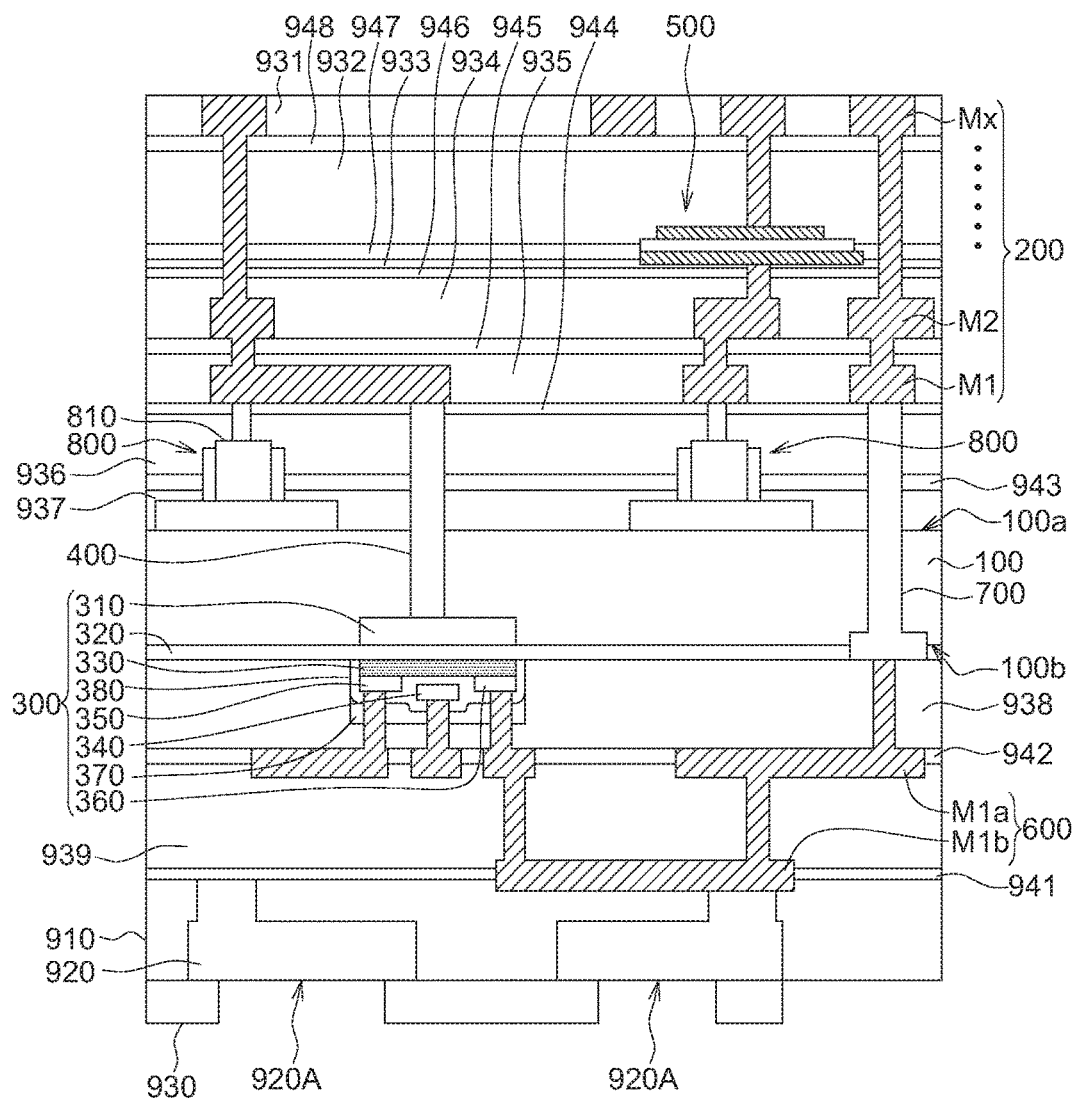
FIG. 2 shows a schematic drawing of a semiconductor device according to another embodiment of the present disclosure.

FIG. 2 shows a schematic drawing of a semiconductor device according to another embodiment of the present disclosure. The elements in the present embodiment sharing similar or the same labels with those in the previous embodiment are similar or the same elements, and the description of which is omitted.

In the present embodiment, as shown in FIG. 2, in the semiconductor device 200, the capacitor 500 is disposed on the first surface 100a of the substrate 100 and located within the interconnection structure 200.

FIG. 3A to FIG. 3G show a process of forming a semiconductor device 10 according to an embodiment of the present disclosure. The elements in the present embodiment sharing similar or the same labels with those in the previous embodiments are similar or the same elements, and the description of which is omitted.

Figure 3A:
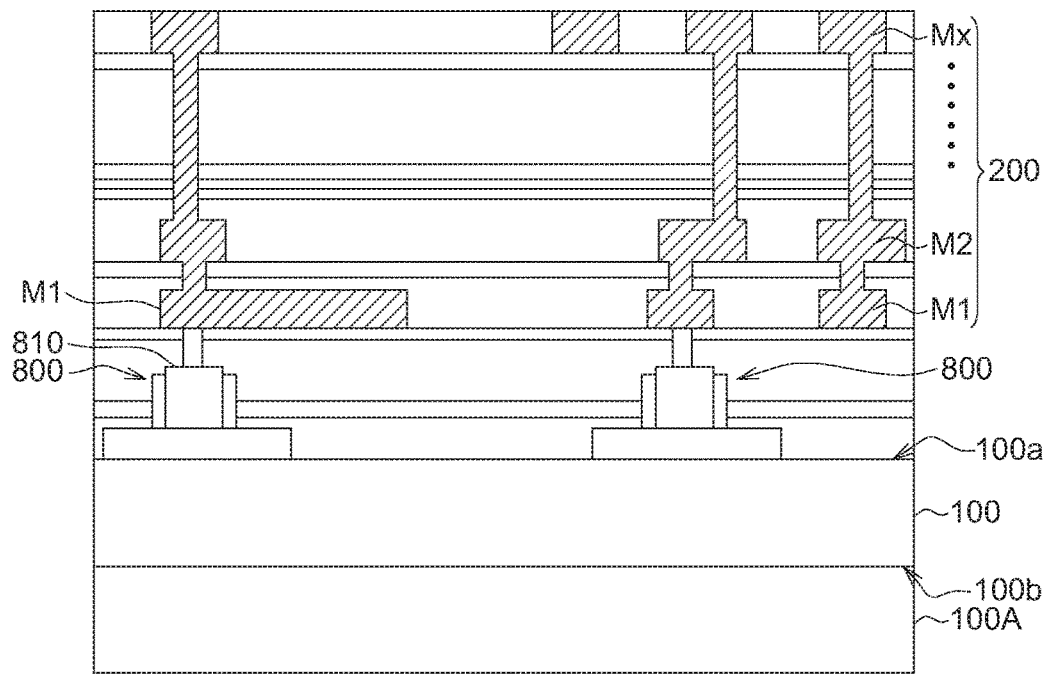
FIG. 3A to FIG. 3G show a process of forming a semiconductor device according to an embodiment of the present disclosure.

Referring to FIG. 3A, a substrate 100 having a first surface 100a and a second surface 100b opposite to the first surface 100a is provided, and an interconnection structure 200 is formed on the first surface 100a. In the embodiments, the substrate 100 may be a buried oxide layer and disposed on a silicon substrate 100A.

As shown in FIG. 3A, a logic device (such as a transistor 800) is formed on the first surface 100a of the substrate 100, and an interconnection structure 200 is formed after forming the logic device. The interconnection structure 200 includes a plurality of metal layers, the plurality of metal layers includes a first metal layer M1, and the first metal layer M1 is most adjacent to the first surface 100a of the substrate 100 among the plurality of metal layers.

As shown in FIG. 3A, a transistor 800 including a polysilicon layer 810 may be formed on the first surface 100a of the substrate 100.

Figure 3B:
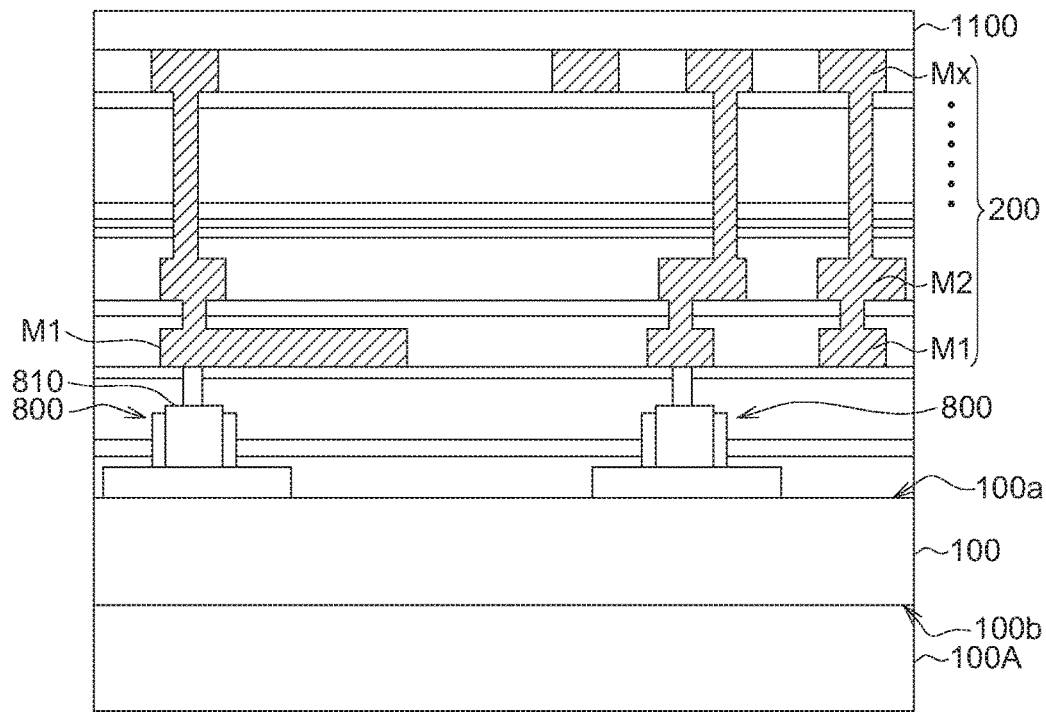

Referring to FIG. 3B, a silicon-containing layer 1100, e.g. a TEOS layer, is formed on the interconnection structure 200. In the embodiments, the silicon-containing layer 1100 covers the interconnection structure 200 and the dielectric layer 931.

Figure 3C:
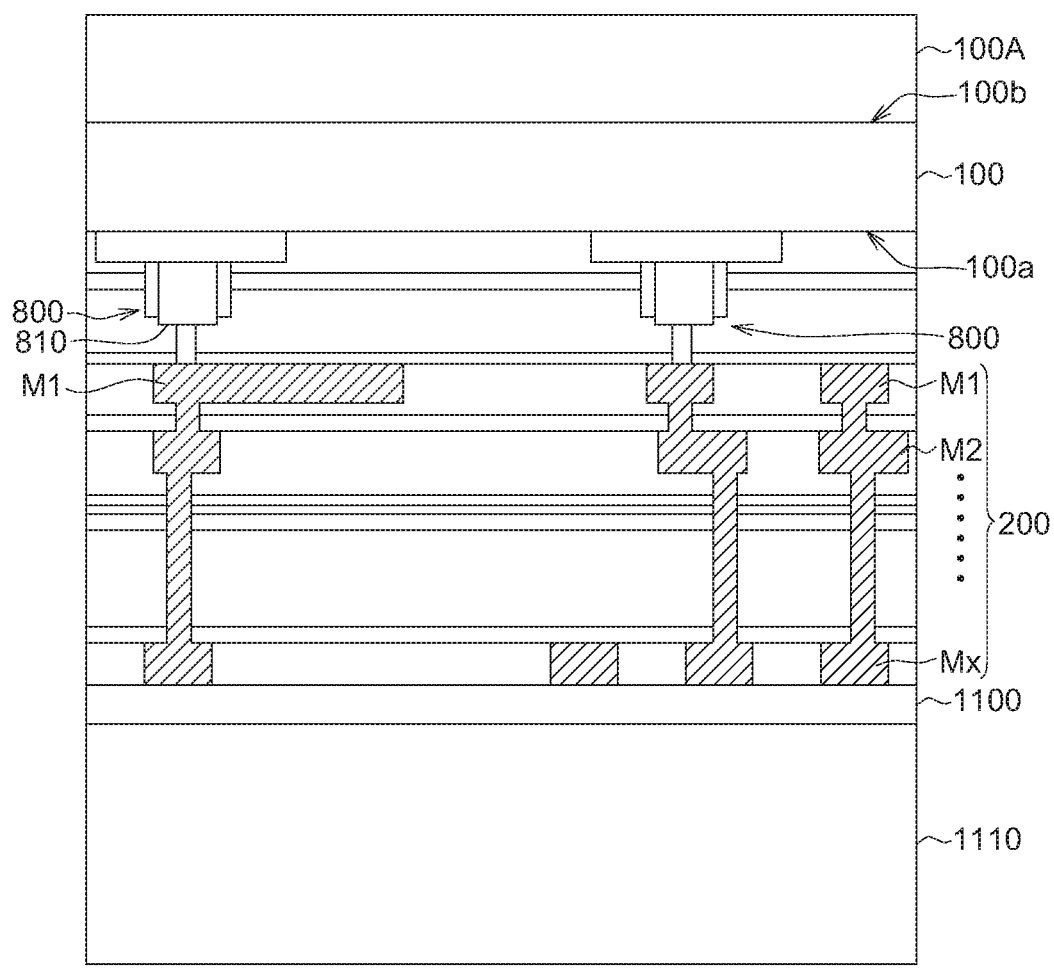

Referring to FIG. 3C, before forming a contact structure, which process will be performed subsequently, a dummy substrate 1110 is attached on the interconnection structure 200. In the embodiment, the dummy substrate 1110 is attached on the interconnection structure 200 through the silicon-containing layer 1100 which is advantageous to the adhesion between the dummy substrate 1110 and the interconnection structure 200.

Figure 3D:
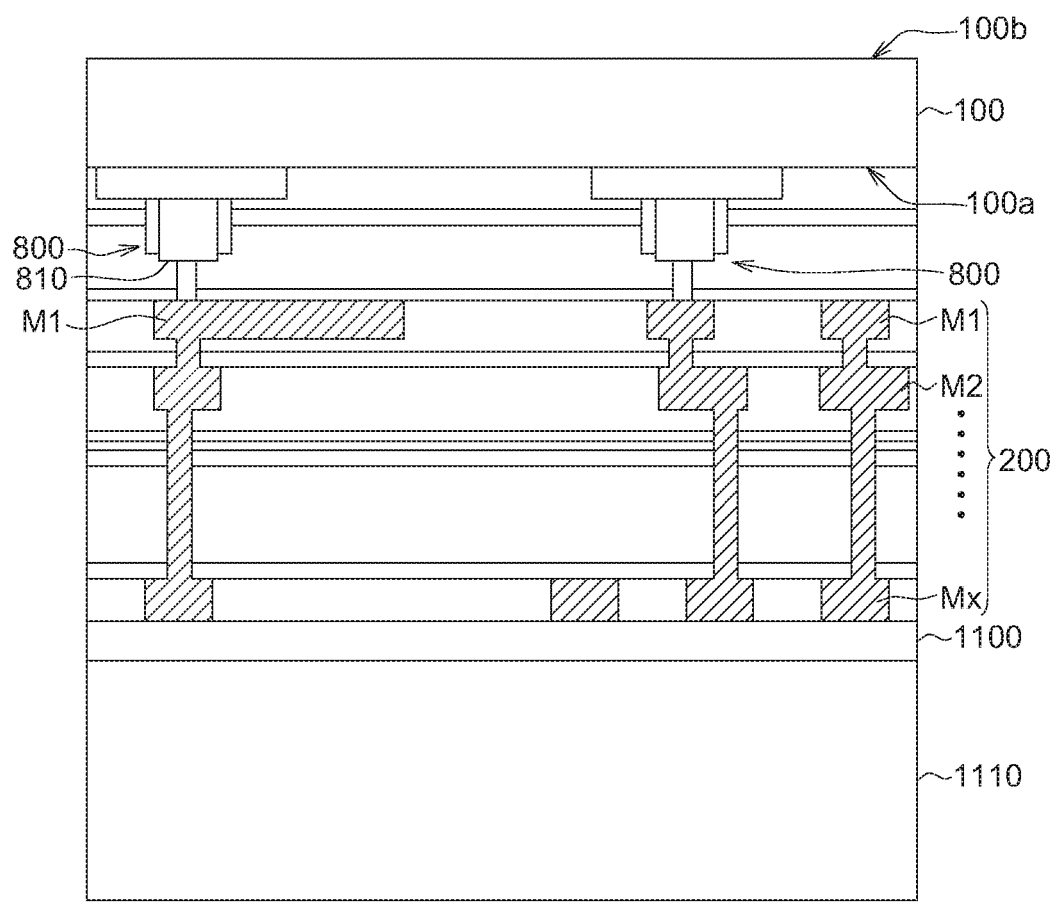

Referring to FIG. 3D, the silicon substrate 100A is removed by grinding.

Figure 3E:
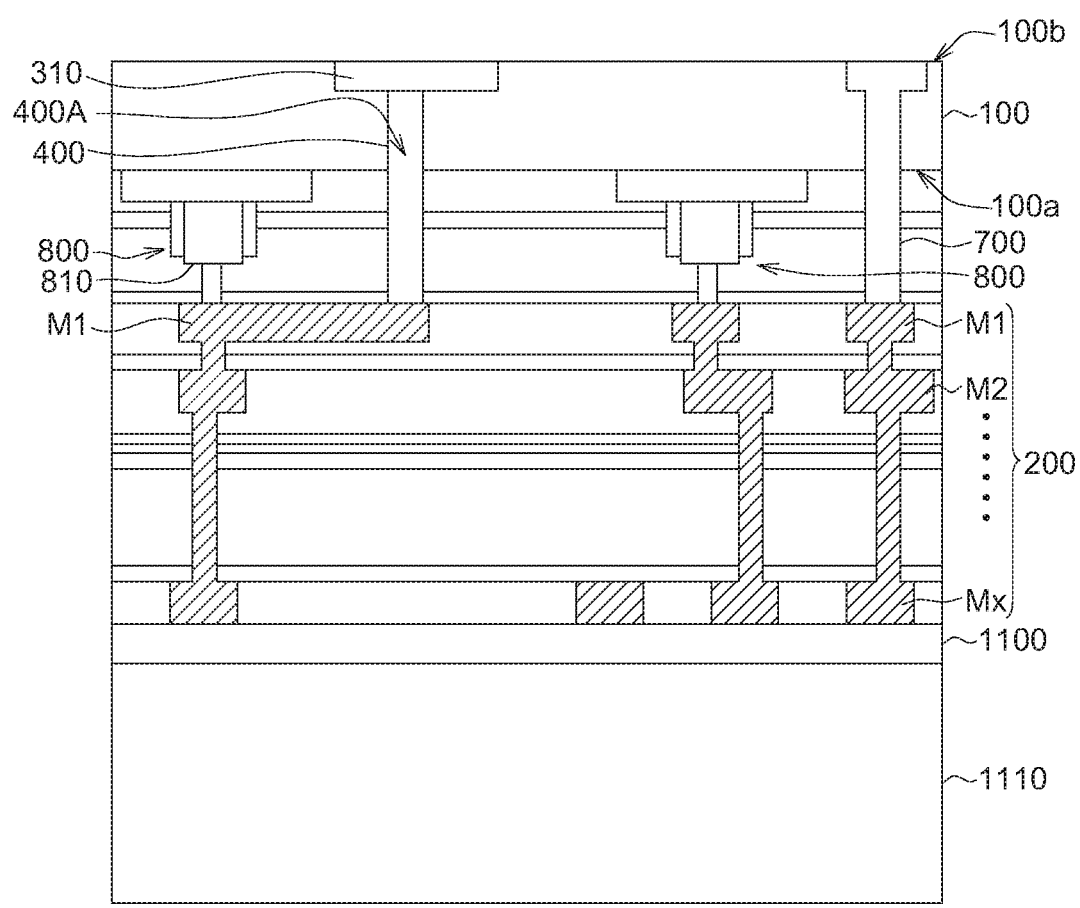
Figure 3F:
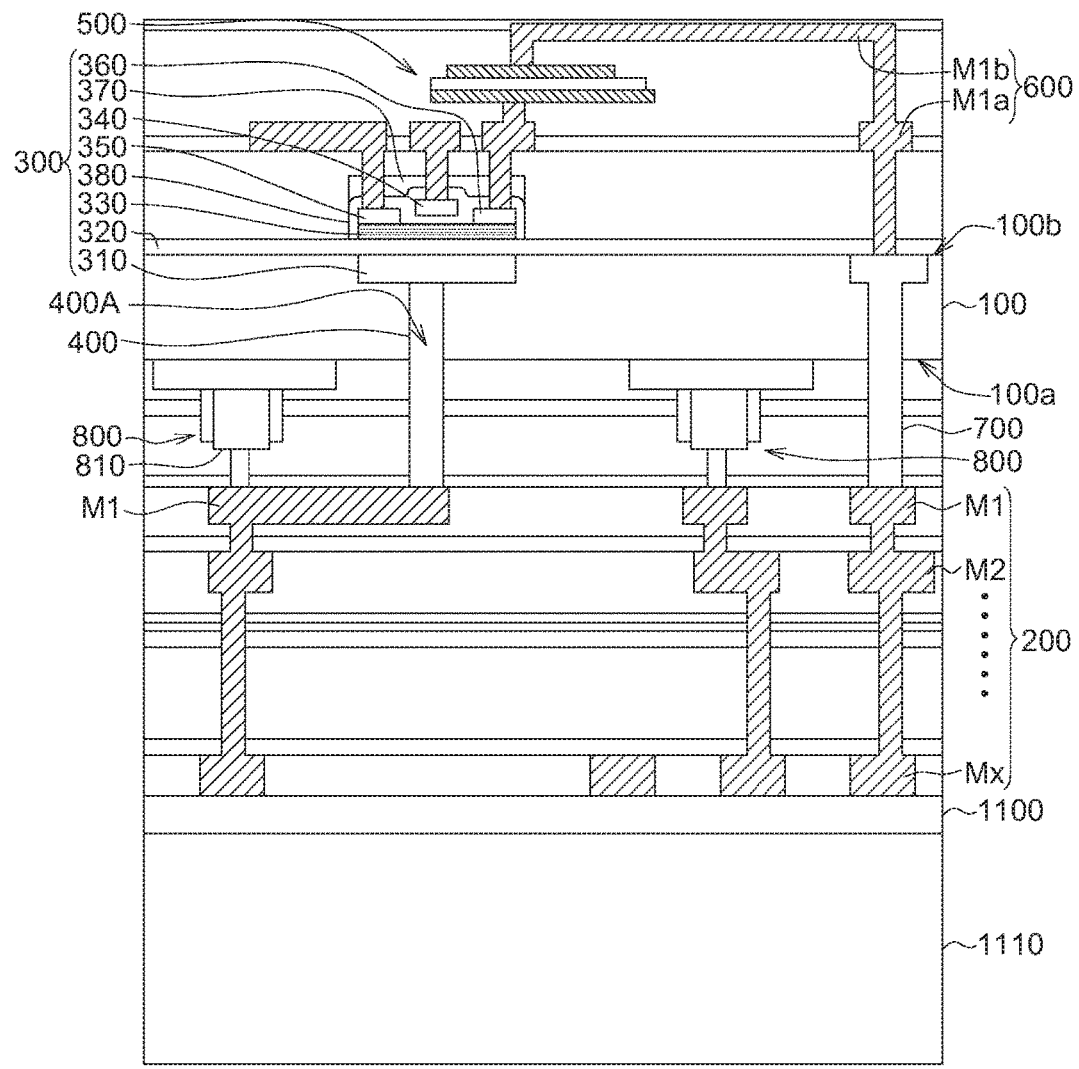

Referring to FIG. 3E to FIG. 3F, a contact structure 400 is formed penetrating through the substrate 100, and an oxide semiconductor (OS) transistor 300 is formed on the second surface 100b. As shown in FIG. 3E, in the embodiments, a contact hole 400A is formed penetrating from the second surface 100b to the first surface 100a of the substrate 100, and a conductive material is filled in the contact hole 400A for forming the contact structure 400.

As shown in FIG. 3E, the contact structure 400 is electrically connected to the first metal layer M1.

As shown in FIG. 3F, forming the OS transistor 300 includes forming a back gate 310 on the second surface 100b of the substrate 100, and the contact structure 400 is electrically connected to the back gate 310. In the embodiments, the back gate 310 and the contact structure 400 may be formed by filling the conductive material in the contact hole 400A in the same process.

As shown in FIG. 3F, the contact structure 400 is located between the back gate 310 of the OS transistor 300 and the interconnection structure 200 and electrically connects the interconnection structure 200 to the back gate 310 of the OS transistor 300.

As shown in FIG. 3F, forming the OS transistor 300 further includes forming a gate insulator film 320 on the back gate 310, forming an oxide semiconductor (OS) layer 330 on the gate insulator film 320, forming a gate electrode 340 on the OS layer 330, and forming two electrodes 350 and 360 on the OS layer 330 and located on two lateral sides of the gate electrode 340.

As shown in FIG. 3F, a capacitor 500 may be further form on the second surface 100b of the substrate 100.

Referring to FIG. 3E to FIG. 3F, an additional interconnection structure 600 may be further formed on the second surface 100b of the substrate 100 and electrically connected to the OS transistor 300, and an additional contact structure 700 may be further formed penetrating through the substrate 100 and electrically connecting the additional interconnection structure 600 to the interconnection structure 200.

Figure 3G:
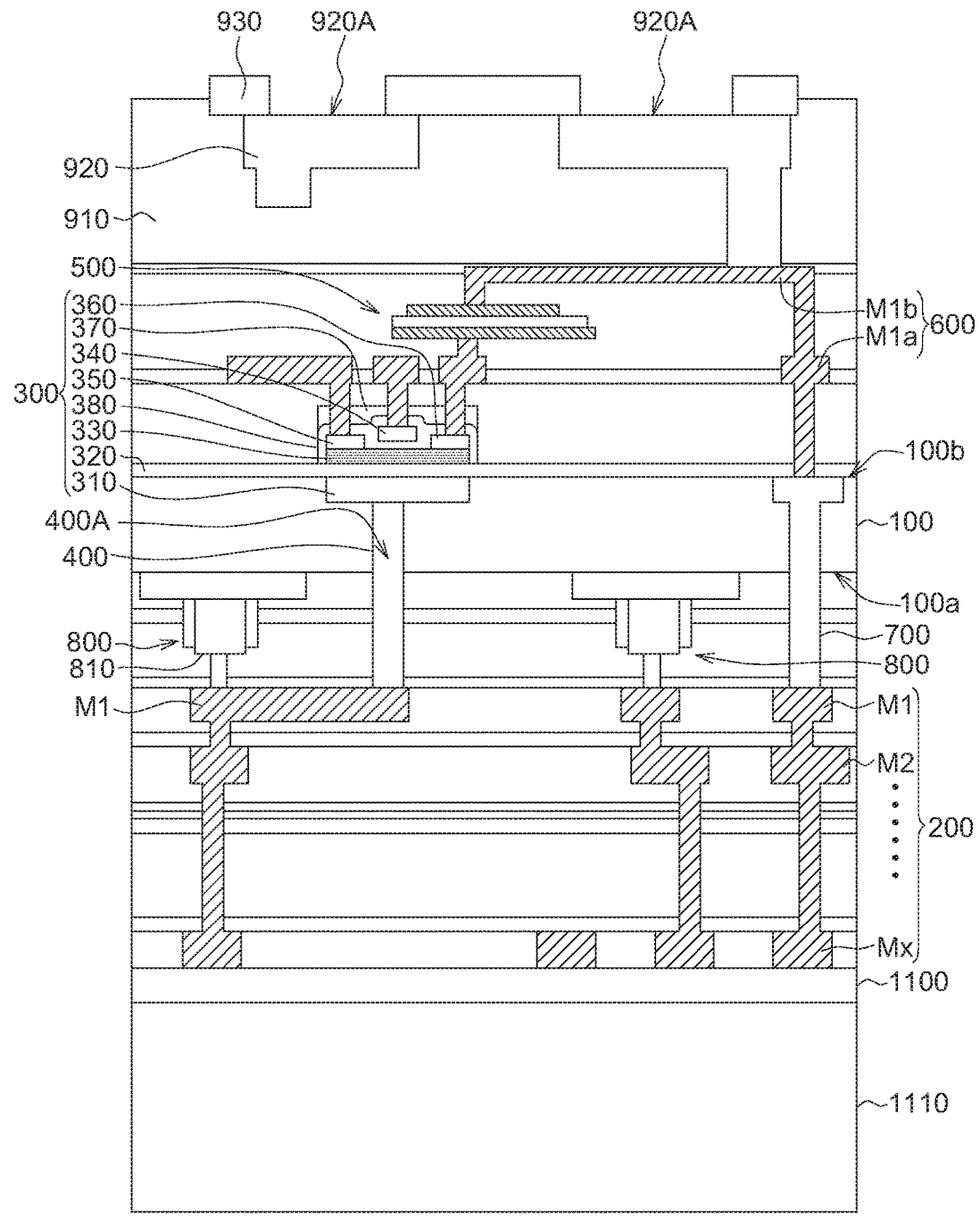

Referring to FIG. 3G, a dielectric layer 910 is formed on the OS transistor 300, and a conductive wiring structure 920 is formed in the dielectric layer 910 exposing a bonding pad region 920A. Then, the dummy substrate 1110 and silicon-containing layer 1100 can be removed; as such, the semiconductor device 10 as shown in FIG. 1 is formed. Afterwards, the subsequently processes can be performed, depending on the design requirements of the practical applications. For example, after forming the semiconductor device 10 as shown in FIG. 1, a (M+1)th metal interconnect layer or more metal interconnect layers can be formed on the interconnection structure 200.

FIG. 4A to FIG. 4G show a process of forming a semiconductor device 20 according to another embodiment of the present disclosure. The elements in the present embodiment sharing similar or the same labels with those in the previous embodiments are similar or the same elements, and the description of which is omitted.

The process of forming the semiconductor device 20 as shown in FIG. 4A to FIG. 4G is similar to the process of forming the semiconductor device 10 as shown in FIG. 3A to FIG. 3G, and the major difference is the formation of the capacitor 500. More specifically, the arranged position and the formation sequence of the formation of the capacitor 500 in the semiconductor device 20 are different from that in the semiconductor device 10.

Figure 4A:
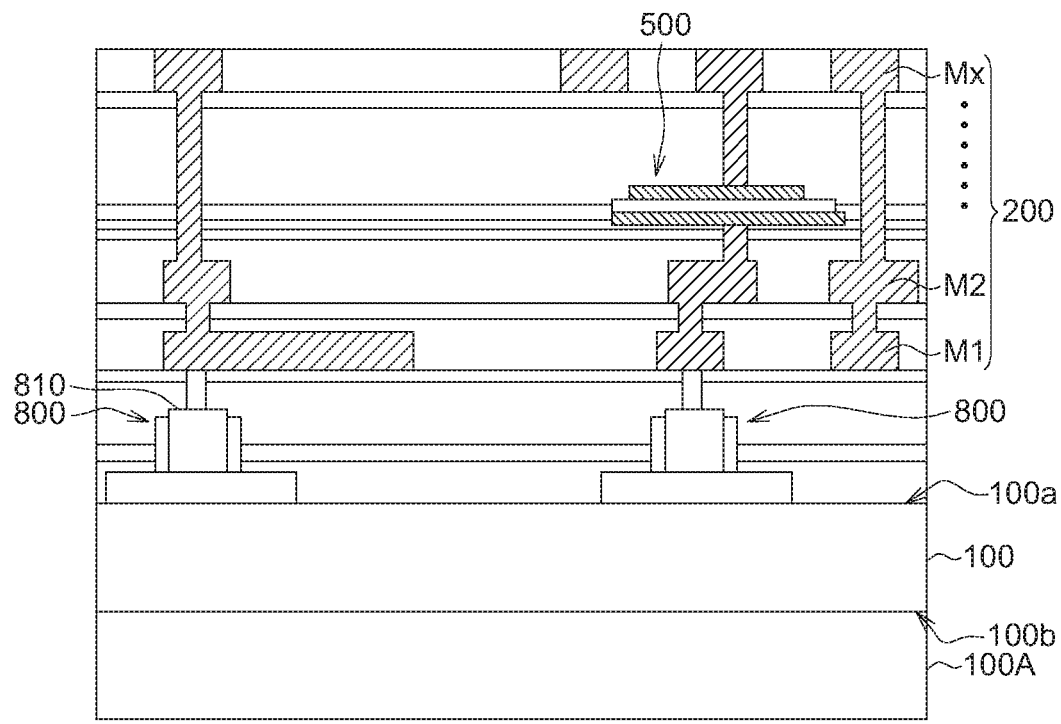
FIG. 4A to FIG. 4G show a process of forming a semiconductor device according to another embodiment of the present disclosure.
Figure 4B:
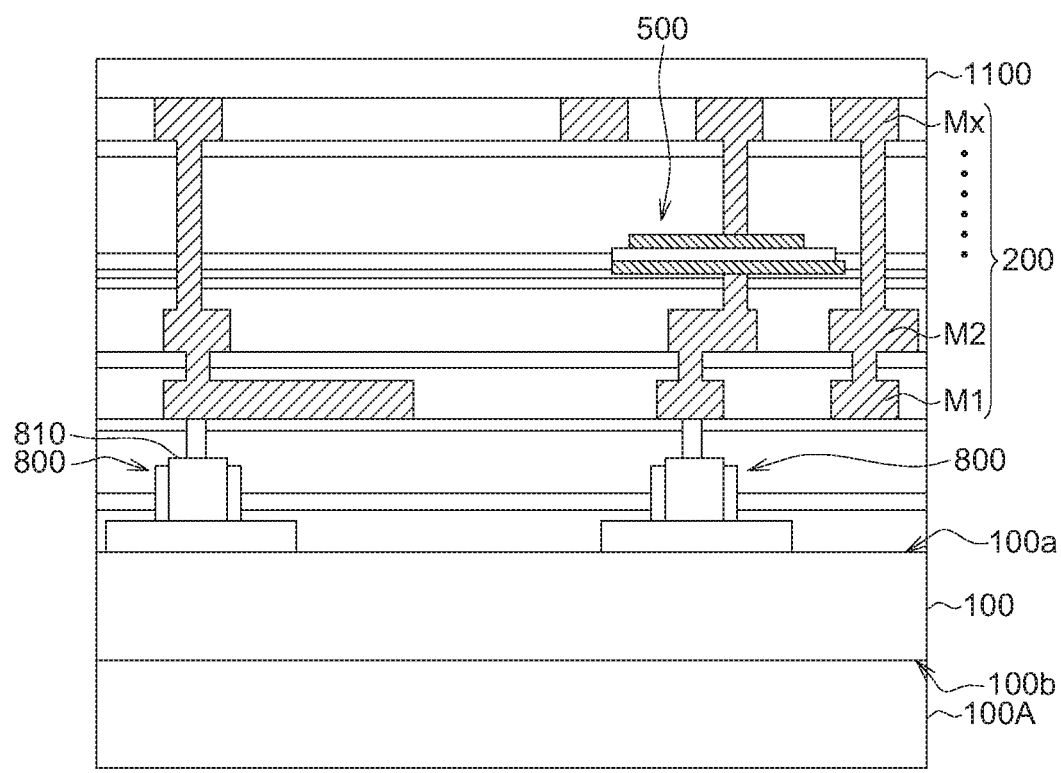
Figure 4C:
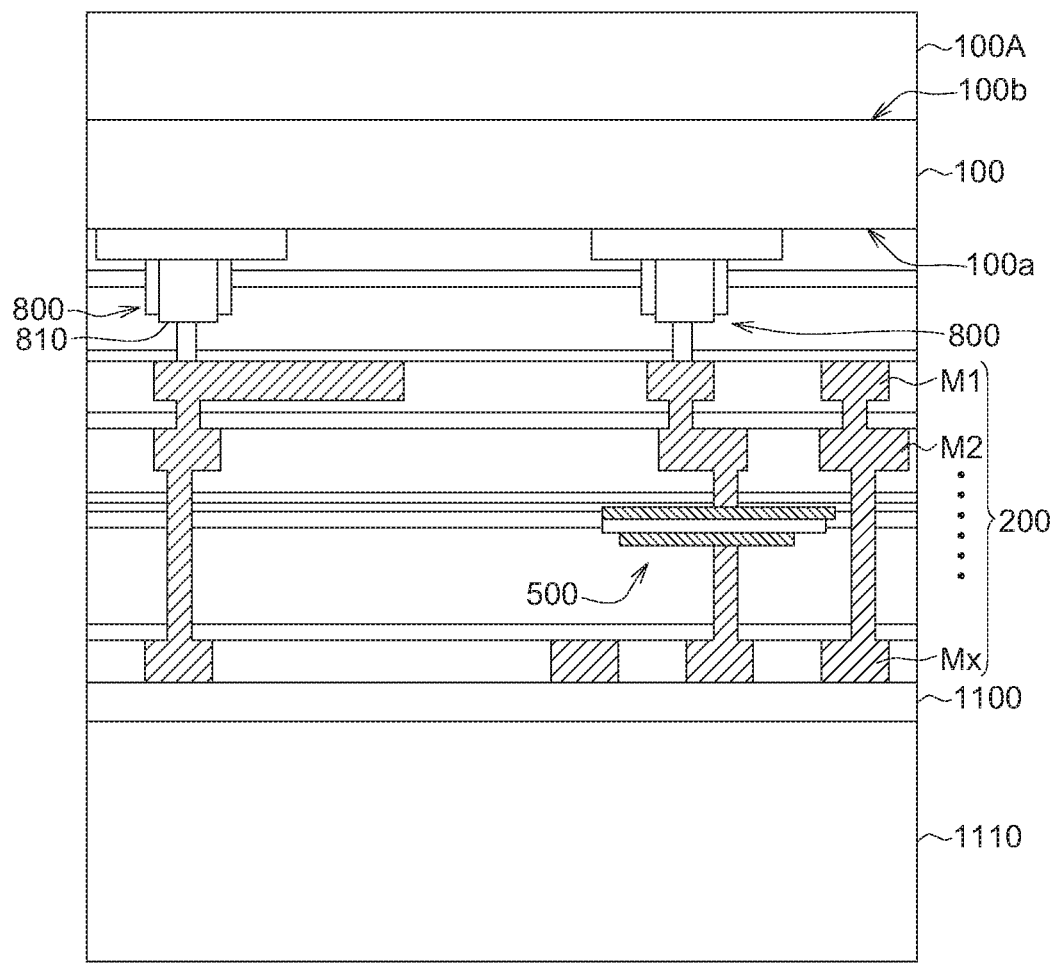
Figure 4D:
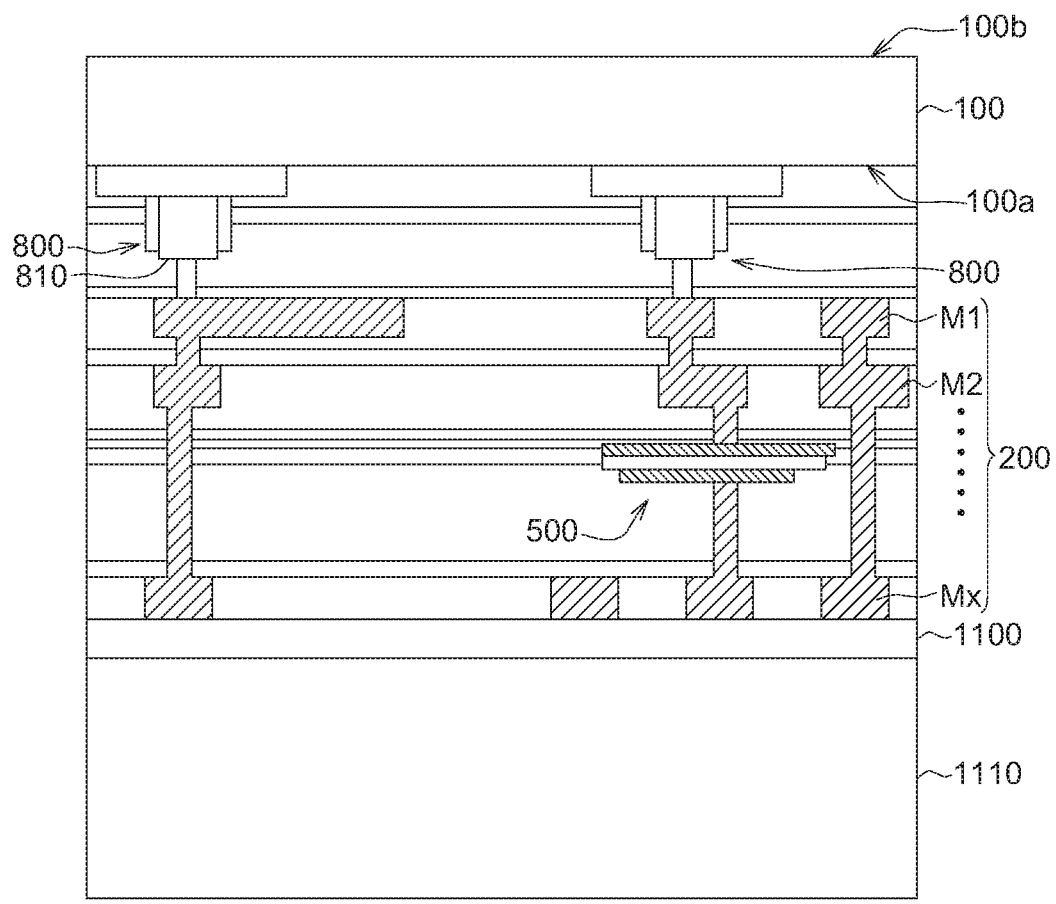
Figure 4E:
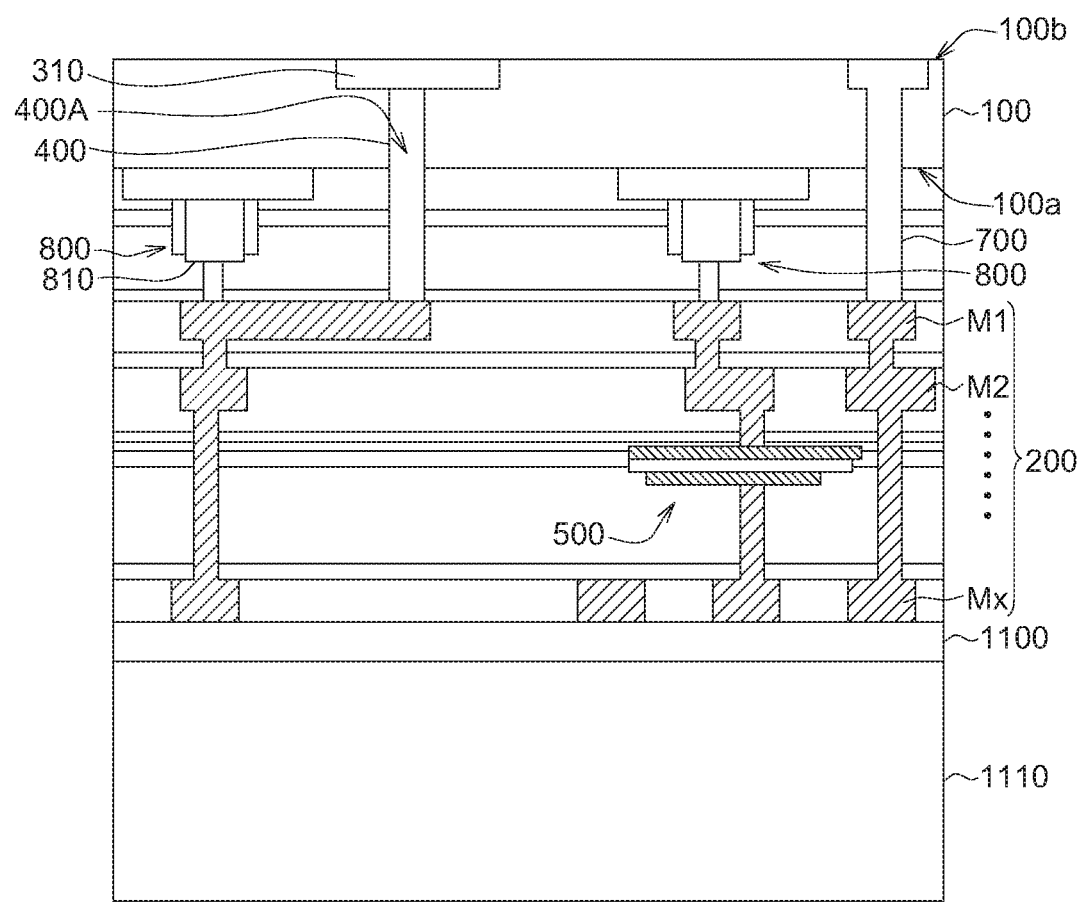
Figure 4F:
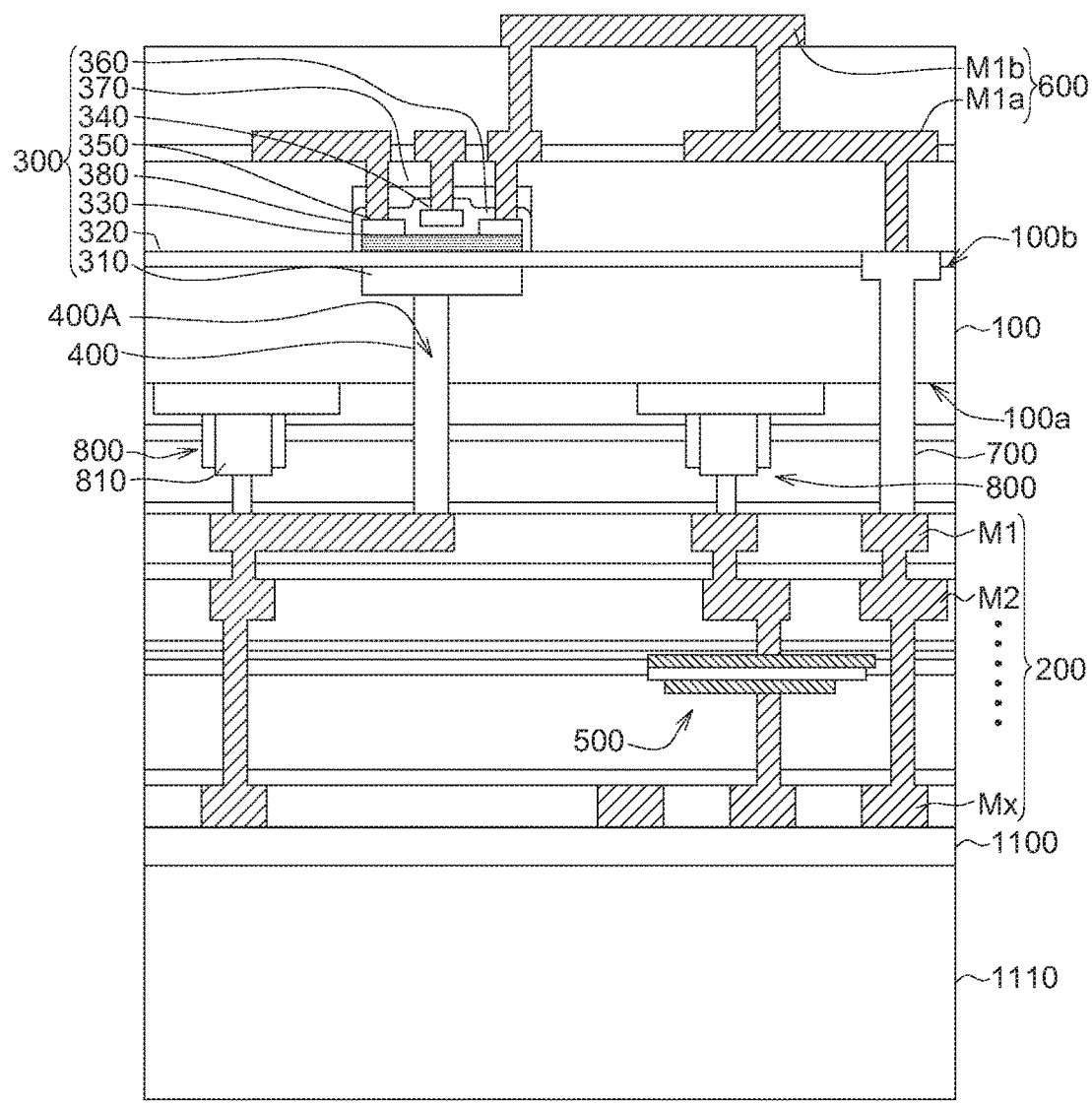
Figure 4G:
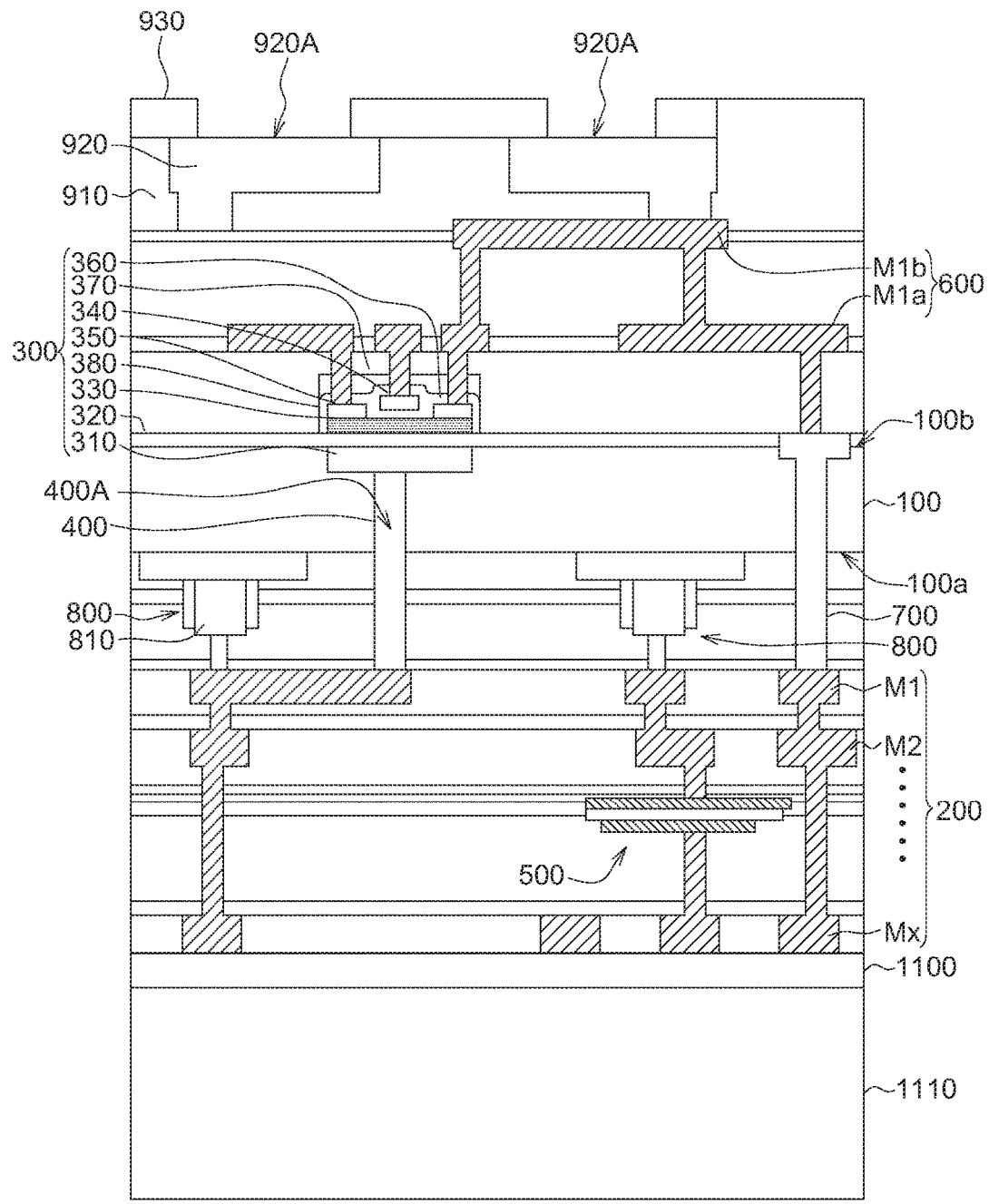

As shown in FIG. 4A, a capacitor 500 is formed on the first surface 100a of the substrate 100 and located within the interconnection structure 200. As compared to the capacitor 500 of the semiconductor device 10, the capacitor 500 and the interconnection structure 200 of the semiconductor device 20 are formed at the same side with respect to the substrate 100, and the capacitor 500 of the semiconductor device 20 is formed prior to the formation of the OS transistor 300.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a semiconductor device, comprising:
   providing a substrate having a first surface and a second surface opposite to the first surface;
   forming a logic device on the first surface;
   after forming the logic device, forming an interconnection structure having M metal layers on the first surface;
   after forming the interconnection structure having the M metal layers, forming a contact structure penetrating through the substrate;
   after forming the contact structure, forming an oxide semiconductor (OS) transistor on the second surface, wherein the contact structure is located between the OS transistor and the interconnection structure and electrically connects the interconnection structure to the OS transistor; and
   forming a (M+1)th metal interconnect layer on the interconnection structure.

2. The method of forming the semiconductor device according to claim 1, wherein the M metal layers and the (M+1) metal interconnect layer are different materials.

3. The method of forming the semiconductor device according to claim 1, further comprising:
   attaching a dummy substrate on the interconnection structure before forming the contact structure.

4. The method of forming the semiconductor device according to claim 1,
   wherein forming the contact structure comprises:
   forming a contact hole penetrating from the second surface to the first surface of the substrate; and
   filling a conductive material in the contact hole.

5. The method of forming the semiconductor device according to claim 1, further comprising:
   forming a dielectric layer on the OS transistor; and
   forming a conductive wiring structure in the dielectric layer exposing a bonding pad region.

6. The method of forming the semiconductor device according to claim 1, further comprising:
   forming a capacitor on the second surface of the substrate.

7. The method of forming the semiconductor device according to claim 1, wherein forming the OS transistor comprises forming a back gate on the second surface of the substrate, and the contact structure is electrically connected to the back gate.

8. The method of forming the semiconductor device according to claim 7, wherein forming the OS transistor further comprises:
   forming a gate insulator film on the back gate;
   forming an oxide semiconductor (OS) layer on the gate insulator film;
   forming a gate electrode on the OS layer; and
   forming two electrodes on the OS layer and located on two lateral sides of the gate electrode.

9. The method of forming the semiconductor device according to claim 1, wherein the interconnection structure comprise a first metal layer, the first metal layer is most adjacent to the first surface of the substrate among the M metal layers, and the contact structure is electrically connected to the first metal layer.

10. The method of forming the semiconductor device according to claim 1, further comprising:
    forming an additional interconnection structure on the second surface of the substrate and electrically connected to the OS transistor; and
    forming an additional contact structure penetrating through the substrate and electrically connecting the additional interconnection structure to the interconnection structure.

* * * * *